(12) United States Patent
Farrar (10) Patent No.: US 6,288,442 B1
(45) Date of Patent: *Sep. 11, 2001

(54) INTEGRATED CIRCUIT WITH OXIDATION-RESISTANT POLYMERIC LAYER

(75) Inventor: Paul A. Farrar, So. Burlington, VT (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,012

(22) Filed: Sep. 10, 1998

(51) Int. Cl.⁷ .................................................. C03C 28/02
(52) U.S. Cl. .................... 257/678; 257/762; 257/751; 257/767; 257/773
(58) Field of Search .................... 257/762, 751, 257/678, 767, 773

(56) References Cited

U.S. PATENT DOCUMENTS

| | | |
|---|---|---|
| 2,842,438 | 7/1958 | Saarivirta et al. . |
| 3,954,570 | 5/1976 | Shirk et al. ............... 201/15 |
| 4,386,116 | 5/1983 | Nair et al. ................ 427/99 |
| 4,423,547 | 1/1984 | Farrar et al. ............ 29/571 |
| 4,574,095 | 3/1986 | Baum et al. ........... 427/53.1 |
| 4,788,082 | 11/1988 | Schmitt ................. 427/248.1 |
| 4,931,410 | 6/1990 | Tokunaga et al. ....... 437/189 |
| 4,962,058 | 10/1990 | Cronin et al. .......... 437/187 |
| 4,996,584 * | 2/1991 | Young et al. ........... 257/762 |
| 5,019,531 * | 5/1991 | Awaya et al. .......... 437/180 |
| 5,100,499 | 3/1992 | Douglas ................ 156/635 |
| 5,149,615 | 9/1992 | Chakravorty et al. ....... 430/313 |
| 5,158,986 | 10/1992 | Cha et al. ............. 521/82 |
| 5,173,442 | 12/1992 | Carey .................... 437/417 |
| 5,240,878 | 8/1993 | Fitzsimmons et al. . |
| 5,243,222 * | 9/1993 | Harper et al. ........... 257/774 |

(List continued on next page.)

OTHER PUBLICATIONS

Palleau, J., et al., "Refractory Metal Encapsulation in Copper Wiring", Advanced Metallization for Devices and Circuits—Science, Technology and Manufacturability, Materials Research Society Symposium Proceedings, 337, pp. 225–231, (Apr. 1994).

Iijima, T., et al., "Microstructure and Electrical Properties of Amorphous W—Si—N Barrier Layer for Cu Interconnections", 168–173, (1996).

Metals Handbook, 8th Edition 8, 300, 302, Electronic Materials Handbook, ASM International, 1, Packaging, 105, 768–772, (1989).

(List continued on next page.)

Primary Examiner—Fetsum Abraham
(74) Attorney, Agent, or Firm—Schwegman, Lundberg, Woessner & Kluth, P.A.; Eduardo E. Drake (57) ABSTRACT

A typical integrated circuit interconnects millions of microscopic transistors and resistors with aluminum wires buried in silicon-dioxide insulation. Yet, aluminum wires and silicon-dioxide insulation are a less attractive combination than gold, silver, or copper wires combined with polymer-based insulation, which promise both lower electrical resistance and capacitance and thus faster, more efficient circuits. Unfortunately, conventional etch-based techniques are ineffective with gold, silver, or copper, and conventional polymer formation promote reactions with metals that undermine the insulative properties of polymer-based insulations. Accordingly, the inventor devised methods which use a liftoff procedure to avoid etching problems and a non-acid-polymeric precursor and non-oxidizing cure procedure to preserve the insulative properties of the polymeric insulator. The resulting interconnective structures facilitate integrated circuits with better speed and efficiency.

14 Claims, 4 Drawing Sheets

U.S. PATENT DOCUMENTS

| | | | |
|---|---|---|---|
| 5,256,205 | 10/1993 | Schmitt, III et al. | 118/723 |
| 5,334,356 | 8/1994 | Baldwin et al. | 422/133 |
| 5,354,712 * | 10/1994 | Ho et al. | 437/195 |
| 5,426,330 * | 6/1995 | Joshi et al. | 257/752 |
| 5,442,237 | 8/1995 | Hughes et al. | 257/759 |
| 5,470,789 | 11/1995 | Misawa | 437/190 |
| 5,470,801 | 11/1995 | Kapoor et al. | 437/238 |
| 5,476,817 | 12/1995 | Numata | 437/195 |
| 5,506,449 | 4/1996 | Nakano et al. | 257/758 |
| 5,529,956 | 6/1996 | Morishita | 437/195 |
| 5,538,922 | 7/1996 | Cooper et al. | 437/195 |
| 5,539,060 * | 7/1996 | Tsunogae et al. | 525/338 |
| 5,625,232 | 4/1997 | Numata et al. | 257/758 |
| 5,635,253 | 6/1997 | Canaperi et al. | 427/127 |
| 5,662,788 | 9/1997 | Sandhu et al. | 205/87 |
| 5,674,787 | 10/1997 | Zhao et al. | 437/230 |
| 5,675,187 | 10/1997 | Numata et al. | 257/758 |
| 5,679,608 | 10/1997 | Cheung et al. | 437/195 |
| 5,681,441 | 10/1997 | Svendsen et al. | 205/114 |
| 5,695,810 | 12/1997 | Dubin et al. | 427/96 |
| 5,739,579 * | 4/1998 | Chiang et al. | 257/635 |
| 5,780,358 * | 7/1998 | Zhou et al. | 438/645 |
| 5,785,570 | 7/1998 | Bruni | 445/52 |
| 5,792,522 * | 8/1998 | Jin et al. | 427/575 |
| 5,891,804 * | 4/1999 | Havemann et al. | 438/674 |
| 5,893,752 | 4/1999 | Zhang et al. | 438/687 |
| 5,897,370 * | 4/1999 | Joshi et al. | 438/632 |
| 5,913,147 | 6/1999 | Dubin et al. | 438/687 |
| 5,932,928 | 8/1999 | Clampitt | 257/758 |
| 5,933,758 | 8/1999 | Jain | 438/687 |
| 5,968,333 | 10/1999 | Nogami et al. | 205/184 |
| 5,969,422 | 10/1999 | Ting et al. | 257/762 |
| 5,976,710 | 11/1999 | Sachdev et al. | 428/620 |
| 6,030,877 | 2/2000 | Lee et al. | 438/381 |
| 6,054,172 | 4/2000 | Robinson et al. | 427/97 |
| 6,069,068 | 5/2000 | Rathore et al. | 438/628 |

OTHER PUBLICATIONS

"Kirk–Othmer Concise Encyclopedia of Chemical Technology", M. Grayson (ed), Wiley–Interscience, New York, NY (1985), 433–435, 926–938, (1985).

"Properties and Selection: Nonferrous Alloys and Pure Metals", Metals Handbook Ninth Edition, 2, ASM International, 157,395, (1979).

"Improved Metallurgy for Wiring Very Large Scale Integrated Circuits", International Technology Disclosures, 4(9), (Sep. 25, 1986).

"Formation of Conductors at Variable Depths", Research Disclosure, 1, (Jul. 10, 1998).

Abe, K., et al., "Sub–half Micron Copper Interconnects Using Reflow of Sputtered Copper Films", VLSI Multilevel Interconnection Conference, 308–314, (Jun. 25–27, 1995).

Bai, G., et al., "Copper Interconnection Deposition Techniques and Integration", 1996 Symposium on VLSI Technology, Digest of Technical Papers, 48–49, (1996).

Braud, E., et al., "Ultra Thin Diffusion Barriers for Cu Interconnections at The Gigabit Generation and Beyond", VMIC Conference Proceedings, 174–179, (1996).

Ding, et al., "Copper Barrier, Seed Layer and Planerization Technologies", VMIC Conference Proceedings, 87–92, (1997).

Ernst, et al., "Growth Model for Metal Films on Oxide Surface: Cu on ZnO(0001)–O", Physical Review B, vol. 47, No. 20, 13782–96, (1993).

Godbey, L.J., et al., "Copper Diffusion in Organic Polymer Resists and Inter–level Dielectrics", International Conference on Metallurgical Coatings and Thin Films, Paper H2.04, San Diego, CA To be published, 313, (Apr. 21–25, 1997).

Hirao, S., et al., "A Novel Copper Reflow Process Using Dual Wetting Layers", 1997 Symposium on VLSI Technology, Digest of Technical Papers, 57–58, (1997).

Izaki, M., et al., "Characterization of Transparent Zinc Oxide Films Prepared by Electrochemical Reaction", Journal of the Electrochemical Society, vol. 144, No. 6, 1949–52, (Jun. 1997).

Jayaraj, K., et al., "Low Dielectric Constant Microcellular Foams", Proceedings from the Seventh Meeting of the DuPont Symposium on Polymides in Microelectrics, 474–501, (1996).

Jin, et al., "Porous Xerogel Films as Ultra–low Permitivity Dielectrics for AILS Interconnect Applications", Advanced Metallization and Interconnect Systems for ULSI Applications, Boston, MA, (Oct. 1996).

Kang, H.K., et al., "Grain Structure and Electromigration Properties of CVD CU Metallization", Proceedings of the 10th International VLSI Multilevel Interconnection Conference, 223–229, (Jun. 8–9, 1993).

Laursen, T., et al., "Encapsulation of Copper by Nitridation of Cu—Ti Alloy/Bilayer Structures", International Conference on Metallurgical Coatings and Thin Films, Paper H1.03, San Diego, CA, 309, (Apr. 21–25, 1997).

Miller, et al., "Low Dielectric Constant Polyimides and Polyimide Nanofoams", Seventh Meeting of the DuPont Symposium on Polymides in Microelectronics, 443–473, (Sep. 1996).

Miyake, T., et al., "Atomic Hydrogen Enhanced Reflow of Copper", Applied Physics Letters, vol. 70, No. 10, 1239–41, (1997).

Murarka, S.P., et al., "Copper Interconnection Schemes: Elimination of The Need of Diffusion Barrier/Adhesin Promoter by the User of Corrosion Resistant, Low Resistivity Doped Copper", SPIE, 2335, 80–90.

Park, C.W., et al., "Activation Energy for Electromigration in Cu Films", Applied Physics Letters, vol. 59, No. 2, 175, (1991).

Ramos, T., et al., "Nanoporous Silica for Dielectric Constant Less Than 2", Advanced Metallization and Interconnect Systems for ULSI Applications, Boston, MA, (1996).

Rossnagel, S.M., "Magnetron Sputter Deposition of Interconnect Applications", Conference Proceedings, ULSI XI, Materials Research Society, 227–32, (1996).

Saarivirta, M.J., "High Conductivity Copper Rich Cu—Zr Alloys", Trans. Met. Soc. AIME 218, 431–437, (1960).

Shacham–Diamand, Y., "100 nm Wide Copper Lines Made by Selective Electroless Deposition", Journal of Micromechanics and Microengineering, 1(1), 66–72, (Mar. 1991).

Srivatsa, A.R., et al., "Jet Vapor Deposition: an Alternative to Electrodeposition", Surface Engineering, vol. 11, No. 1, 75–77, (1995).

Tao, J., et al., "Electromigration Characteristics of Copper Interconnects", IEEE Electron Devices Letters, vol. 14, No. 5, 249, (1993).

Ting, C.H., "Low K Material/Process Development", Multilevel Interconnection State–of–the–Art Seminar, Santa Clara, CA, 172–212, (Jun. 21, 1996).

Van Vlack, L.H., "Elements of Materials Science", Addison–Wesley Publishing Co., Inc. Reading, MA, 468, (1959).

Wang, X.W., et al., "Highly Reliable Silicon Nitride Thin Films Made by Jet Vapor Deposition", *Japanese Journal of Applied Physics 34*, Pt. 1, No. 23, 955–58, (1995).

Wolf, S., "Silicon Processing for the VLSI Era", *Process Technology*, 1, Lattice Press, Sunset Beach, CA, 514–538, (1986).

Chakravorty, K.K., et al., "High–Density Interconnection Using Photosensitive Polyimide and Electroplated Copper Conductor Lines", *IEEE Transactions on Components, Hybrids, and Manufacturing Technology,* 13, 200–206, (Mar., 1990).

Tsukada, T., et al., "Adhesion of copper films on ABS polymers deposited in an internal magnet magnetron sputtering system", *J. Vac. Sci. Technol.,* 16(2), 348–351, (1979).

* cited by examiner

INTEGRATED CIRCUIT WITH OXIDATION-RESISTANT POLYMERIC LAYER

FIELD OF THE INVENTION

The present invention concerns methods of fabricating integrated circuits, particularly methods of forming integrated-circuit wiring, or interconnects, from metals, such as gold, silver, and copper.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together to define a specific electric circuit, such as a computer memory.

Interconnecting millions of microscopic components typically follows one of two different methods, both of which initially entail covering the components with an insulative layer. In the first method, fabricators dig small holes in the insulative layer to expose portions of the components underneath and then, through metallization, the process of depositing a metal, they cover the entire insulative layer with a thin layer, or sheet, of aluminum, filling the holes with aluminum. Fabricators then apply an etch-resistant mask, which defines a wiring pattern, to the aluminum layer and subsequently etch, or dissolve, away unwanted aluminum, leaving behind an aluminum wiring pattern. The second method, known as a damascene process, entails digging trenches between the small holes in the insulative layer and then covering the entire insulative layer with aluminum, filling the holes and trenches with aluminum. Fabricators then polish off the metal outside the holes and trenches, leaving aluminum in the holes and trenches to define the wiring pattern. Both methods typically yield aluminum wires that are about one micron thick, or about 100 times thinner than a human hair.

Silicon dioxide and aluminum are the most common insulative and conductive materials used to form interconnections today. However, at submicron dimensions, that is, dimensions appreciably less than one micron, aluminum and silicon-dioxide interconnection systems present higher electrical resistances and capacitances which waste power and slow down integrated circuits. Moreover, at these smaller dimensions, aluminum exhibits insufficient electromigration resistance, a characteristic which promotes disintegration of the aluminum wires at certain current levels. This ultimately undermines reliability, not only because disintegrating wires eventually break electrical connections but also because aluminum diffuses through surrounding silicon-dioxide insulation, forming short circuits with neighboring wires. Thus, aluminum and silicon-dioxide interconnection systems waste power, slow down integrated circuits, and compromise reliability.

Several metals, such as gold, silver, and copper, appear, because of their lower electrical resistances and higher electromigration resistances, to be promising substitutes for aluminum. And, many polymeric insulators, for example, fluorinated polyimides, because of their lower dielectric constants—an indicator of how much capacitance they will introduce—appear to be promising substitutes for silicon dioxide. Lower capacitance translates into faster, more efficient integrated circuits. Thus, a marriage of these metals with polymers promises to yield low-resistance, low-capacitance interconnective structures that will improve the speed, efficiency, and reliability of integrated circuits.

Unfortunately, conventional etch-based interconnection techniques are impractical for making gold, silver, and copper interconnects. Specifically, silver, gold, and copper, are very difficult to etch. In fact, conventional attempts to etch a layer of silver, gold, or copper covered with an etch-resistant mask usually dissolve the mask faster than the gold, silver, or copper. Additionally, conventional techniques of working with polymers promote chemical reactions between the polymers and metals, such as copper, which undermine the insulative and capacitance-reducing properties of the polymers.

Accordingly, to build smaller, faster, more-efficient, and more-reliable integrated circuits, there is not only a need for new fabrication methods that work with gold, silver, and copper but also a need for methods that effectively combine these metals with the advantages of polymeric insulators.

SUMMARY OF THE INVENTION

To address these and other needs, the inventor has developed methods of making integrated-circuit wiring not only from superior metals such as gold, silver, and copper, but also from superior, capacitance-reducing polymeric insulators, thereby facilitating fabrication of integrated circuits with superior speed, efficiency, and reliability. In one method, the inventor incorporates a liftoff processing technique understood throughout the industry to be unsuitable for submicron applications, to successfully make submicron interconnections from gold, silver, and copper.

Conventional liftoff processing entails masking sections of an insulative layer to define a wiring pattern, and depositing a sheet of aluminum over both the masked and unmasked portions of the insulative layer. The mask and overlying deposits of aluminum are then removed or lifted off, leaving behind aluminum wires on the unmasked surface of the insulative layer. Successful liftoff requires a distinct break or separation between the metal deposited on the mask and metal deposited on the insulative layer. Without this distinct break, lifting the mask pulls and breaks or otherwise damages the microscopic metal structures—the wires—deposited on the insulative layer. Ensuring this distinct break, which conventionally requires building a thick mask having openings with steep, high sidewalls, is thought impractical for micron and submicron metallization because of difficulties in forming thick masks with steep-walled micron and submicron openings. These difficulties stemmed principally from inadequate planarization techniques, photolithographic limitations, and etching-control problems.

To overcome these difficulties in forming narrow, steep-walled openings in masks, the inventor recognized not only that current planarization techniques, such as chemical-mechanical planarization, ameliorated the conventional liftoff requirement of using thick masks to ensure the distinct break, but also that the effective thickness of a thinner mask, which is easier to make, could be increased in two ways. First, the inventor uses the mask to form trenches in the underlying insulative layer, which corresponded to openings in the thin mask, before depositing metal, thereby increasing the effective mask thickness by the depth of the trenches. And second, the inventor deposits only a thin, seed, or starter, layer of metal over the mask and in the trenches, not only further ensuring the distinct break necessary for successful liftoff, but also reducing the amount of metal for liftoff.

More precisely, one embodiment of the method forms a mask on an insulative layer and forms a hole or trench in the insulative layer through an opening in the mask. The opening is less than one micron wide. Then, the method deposits metal, for example, silver, gold, or copper, through the mask opening into the hole or trench, only partially filling the trench. The mask is then removed or lifted off with little or no risk of destroying the metal wiring in the trenches. To finish filling the trenches, the method concludes with an electroless metal deposition or selective chemical-vapor deposition, with the earlier deposited metal serving as a seed layer for the post-liftoff deposition.

Moreover, in another embodiment, the invention applies this liftoff technique to form silver, gold, and copper conductors in a polymeric insulator formed and cured using a unique procedure that reduces reactions with metals, particularly copper. The new procedure preserves the insulative and capacitance-reducing properties of the polymeric insulator. In contrast, conventional polymer processing techniques promote the formation of conductive oxides which increase the conductivity of the polymer and thus undermines its insulative and capacitance-reducing properties. Thus, the present invention facilitates the fabrication of integrated circuits with superior speed, efficiency, and reliability.

DETAILED DESCRIPTION OF PREFERRED EMBODIMENTS

The following detailed description, which references and incorporates FIGS. 1–10, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
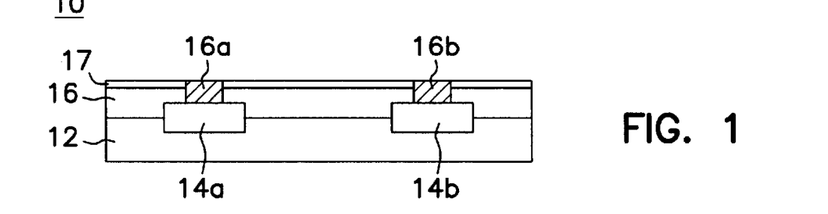
FIG. 1 is a cross-sectional view of an integrated-circuit assembly 10 at an early fabrication stage, including transistors 14a and 14b, an insulative layer 16, contacts 16a and 16b, and a silicon-nitride layer 17.

FIGS. 1–9 show a number of exemplary integrated-circuit assemblies, which taken collectively and sequentially, illustrate an exemplary method of the present invention. The method, as shown in FIG. 1, a cross-sectional view, begins with a known integrated-circuit assembly or structure 10, which can be within any integrated circuit, an integrated memory circuit, for example. Assembly 10 includes a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

Substrate 12 supports a number of integrated elements 14, such as transistors 14a and 14b. Transistors 14a and 14b are covered by a 100-to-500 nanometer-thick, insulative layer 16, which, for example, comprises a silicon oxide. Layer 16 is planarized using chemical-mechanical polishing or other suitable technique. A silicon-nitride layer 17, 50-nanometers thick, covers layer 16. Extending through layers 16 and 17 are two tungsten vias (or contact plugs) 16a and 16b electrically connected to respective transistors 14a and 14b. Although omitted from FIGS. 1–9 for clarity, assembly 10 preferably includes a titanium-silicide diffusion barrier between vias 16a and 16b and transistors 14a and 14b.

Figure 2:
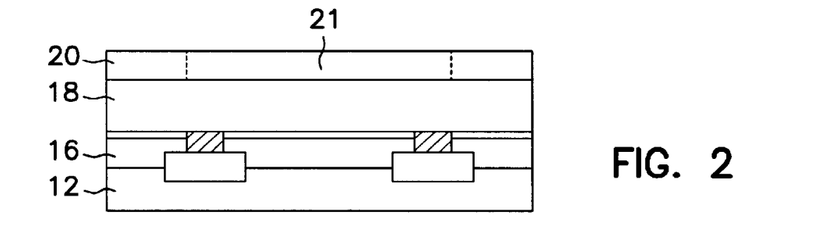
FIG. 2 is a cross-sectional view of the FIG. 1 integrated-circuit assembly after formation of an insulative layer 18 over contacts 16a and 16b and layer 17, a mask 20 saving an opening 21 which exposes a portion of layer 18.

FIG. 2 shows that the first step of the exemplary method entails forming an insulative layer 18 atop layer 17. Examples of suitable insulative materials include silicon oxides, such as silicon dioxide, and polymeric materials, such as polyimides. As used herein, the term "polymeric" encompasses organic polymers, organic oligomers, and organic monomers. Collectively, these may be described as materials containing one or more mer units having a carbon-chain backbone. In addition, "polymeric" encompasses materials having properties similar to those of organic polymers. For instance, organic polymers characteristically have high ductility, low elastic modulus, low compressive-yield strength, and/or low thermal-expansion coefficients. Moreover, as used herein, polymeric encompasses polymer precursors, or bases.

The exemplary embodiment forms insulative layer 18 using a non-acid polymeric precursor, that is, a precursor with a pH greater than about 6, and follows a three-stage curing process which makes layer 18 resistant to oxidation reactions with metals such as copper. For more details on this polymer formation, see U.S. patent application entitled Copper Metallurgy in Integrated Circuits (attorney docket number 303.473US1, Micron reference 97-1060) which is incorporated herein by reference. Unlike conventional polymeric processing, this procedure inhibits undesirable increases in the dielectric constant of the resulting polymeric layer and thus yields faster, more efficient interconnect structures. However, the invention encompasses an unlimited number of insulative materials and procedures for making them.

Figure 3:
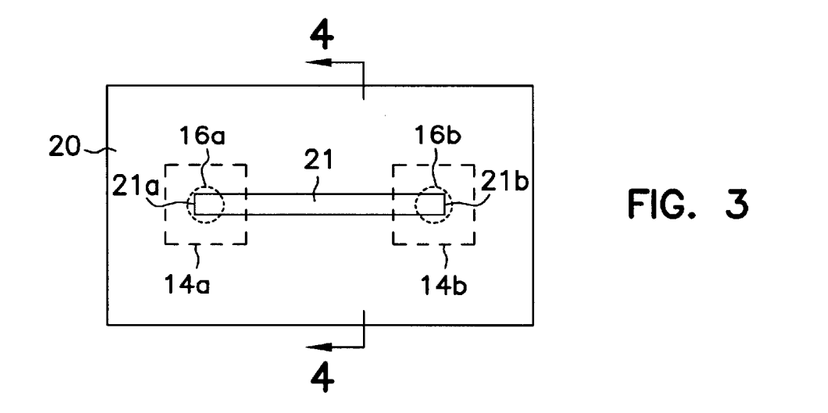
FIG. 3 is a top view of the FIG. 2 integrated-circuit assembly, showing position of opening 21 relative contacts 16a and 16b.

The next step, shown also in FIG. 2 but best illustrated in the FIG. 3 top view, is to form a mask, or stencil, 20 on layer 18, using any suitable masking material and technique, for example, photoresist and conventional photolithography.

Although mask 20, in the exemplary embodiment, is a single-layer structure, other embodiments provide a composite mask structure consisting of two or more photoresist layers with a non-resist material, such as silicon nitride, between each pair of photoresist layers.

Figure 4:
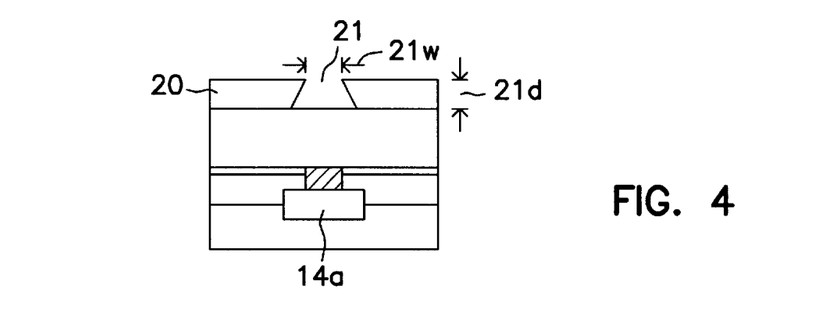
FIG. 4 is a cross-sectional view of the FIG. 3 integrated-circuit assembly, taken along line 4—4 to show depth and width of opening 21.

Mask 20 includes at least one exemplary opening 21, which nominally defines the perimeter of a desired conductor, or metal structure generally. In other embodiments, mask 20 includes hundreds, thousands, or even millions of openings of various shapes and sizes. FIG. 3 shows that opening 21 defines a channel having ends 21a and 21b which overlie respective vias 16a and 16b. FIG. 4, a cross-section of assembly 10 taken along line 4—4 in FIG. 3, shows that opening 21 has a depth 21d of about 500 nanometers and a width 20w of about 250 nanometers, providing an exemplary 2-to-1 aspect ratio. (In contrast conventional liftoff structures range from one to two microns in thickness and have openings with widths of about one micron, because of the conventional wisdom that liftoff is impractical and unreliable for submicron dimensions.) In various embodiments, width 20w is less than about 0.75 microns, less than about 0.5 microns, or less than about 0.25 microns. Opening 21, in the exemplary embodiment, also has negative-sloping sidewalls, although other embodiments provide vertical or even positive sloping sidewalls. The negative-sloping sidewall are formed, for example, using an "image reversal" photographic process. The negative sloping sidewalls facilitate formation of undercut trenches in subsequent steps.

Figure 5:
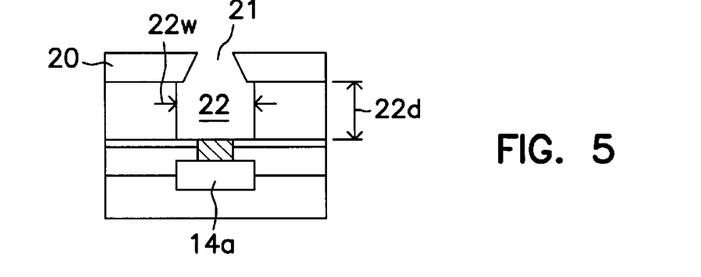
FIG. 5 is a cross-sectional view of the FIG. 4 assembly after using mask 20 to form a trench 22 in layer 18, extending widthwise underneath mask 20.
Figure 6:
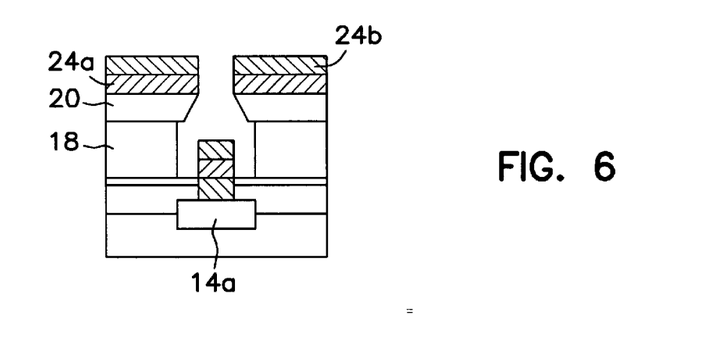
FIG. 6 is a cross-sectional view of the FIG. 5 assembly after using mask 20 to form a barrier layer 24a and a metal-seed layer 24b both of which overlie mask 20 and at least partially fill trench 22.

The next step of the exemplary method, shown in FIG. 5, entails using mask 20 to form a trench 22 in insulative layer 18. Forming trench 22 entails undercutting mask 20 such that trench 22 has a width 22w which, in the exemplary embodiment, is about five percent greater than width 21w of opening 21. As a consequence, mask 20 overhangs the sidewalls of trench 22 and facilitates subsequent liftoff of mask 20 and any overlying metal by ensuring a distinct break or separation between metal deposited on mask 20 and metal deposited in trench 22. To create the overhang, one embodiment forms the trench using an etch process which is not completely anisotropic. Another embodiment uses a hard liftoff mask comprising a silicon-nitride layer between two resist layers and overdevelops the bottom resist layer to create the overhang. However, in other embodiments of the invention, there is no overhang because widths 21w and 22w are substantially equal. In these embodiments, the distinct break results primarily from keeping the thickness of trench deposits less than depth 22d, the depth of trench 22.

The next step, also illustrated in FIG. 5, entails partially filling trench 22 with a conductive metal. More specifically, the exemplary method grows or deposits a 10-nanometer-thick barrier layer 24a and a 50-nanometer-thick metal-seed layer 24b on mask 20 and inside trench 22, only partially filling trench 22. Barrier layer 24a prevents diffusion of metal through insulative layer 18. One suitable technique for forming layers 24a and 24b is physical vapor deposition. Examples of suitable barrier materials include zirconium, hafnium, titanium, tantalum, and tantalum nitride. The principle purpose of seed layer 24b, which may also be called a starter layer, is to control placement of material deposited during subsequent selective deposition processes. In the exemplary embodiment, seed layer 24b comprises copper; however, in other embodiments, layer 24b comprises more-conductive metals, such as silver and gold. In general, the method is not limited to any particular metals, or type of metals. Indeed, the method can be practiced with non-metallic materials.

Figure 7:
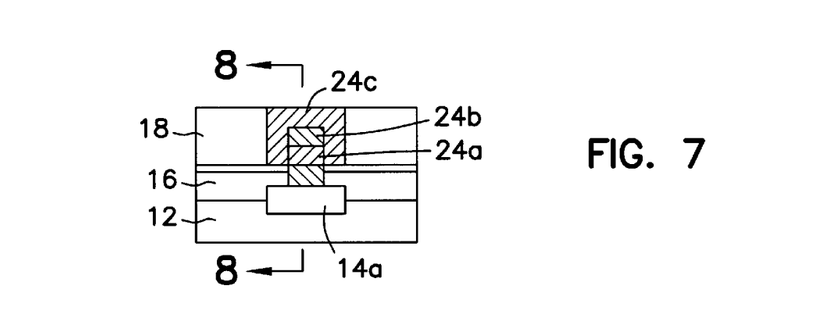
FIG. 7 is a cross-sectional view of the FIG. 6 assembly after removing, or lifting off, mask 20 and overlying portions of layers 24a and 24b and after forming conductive layer 24c atop layer 24b in trench 20.

Next, as FIG. 7 shows, the method entails removing or lifting off mask 20 and overlying portions of layers 24a and 24b, leaving behind the portions of layers 24a and 24b occupying trench 22. One suitable method of lifting off mask 20 and the overlying portions of layers 24a and 24b is to use a two-stage tape-assisted liftoff, a technique which entails lifting off the overlying metal using a first adhesive strip or patch of material and then using a chemical-resist-removal process to remove any remaining mask material. Another suitable technique entails dissolving the mask, for example, in a liquid etchant. The invention encompasses all techniques for removing the mask and overlying metal without completely destroying the portions of layers 24a and 24b in trench 22.

After removal of mask 20 and excess portions of layers 24a and 24b, the method entails continued filling of trench 22 with a conductive metal, such as gold, silver, or copper, to form a conductive metal layer 24c atop layer 24b. The exemplary method fills the trench substantially flush with the top surface of insulative layer 18, using a selective electroless plating or selective chemical-vapor deposition. (As used herein, electroless plating, or deposition, at least encompasses any autocatalytic deposition of a film through the interaction of a metal salt and a chemical reducing agent.) For an example of an electroless deposition of copper, see U.S. Pat. No. 4,574,095, which is entitled Electroless Copper Deposition on Metals and Silicides and incorporated herein by reference.

Figure 8:
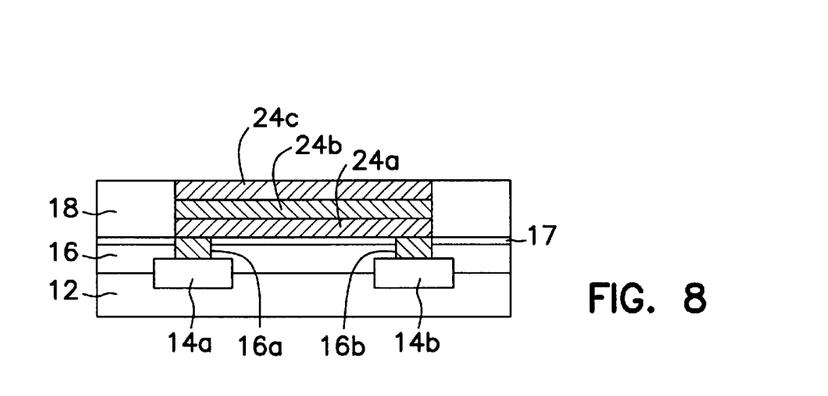
FIG. 8 is a cross-sectional view of the FIG. 7 assembly showing that conductor 24, which includes layers 24a, 24b, and 24c, connects not only contacts 16a and 16b but also transistors 14a and 14b.

FIG. 8, a cross-sectional view taken along line 8—8 in FIG. 7, shows the resulting three-layer metal conductor 24, which electrically connects vias 16a and 16b and therefore connects transistors 14a and 14b. In the exemplary embodiment, conductor 24 has a width 24w of about 0.15 microns, which is about 700 percent less than the width of conductors normally formed using conventional liftoff procedures. However, in other embodiments, width 24w is less than about 0.75 microns, less than about 0.5 microns, or less than about 0.25 microns. Formation of conductor 24 completes the first level of metallization.

Figure 9:
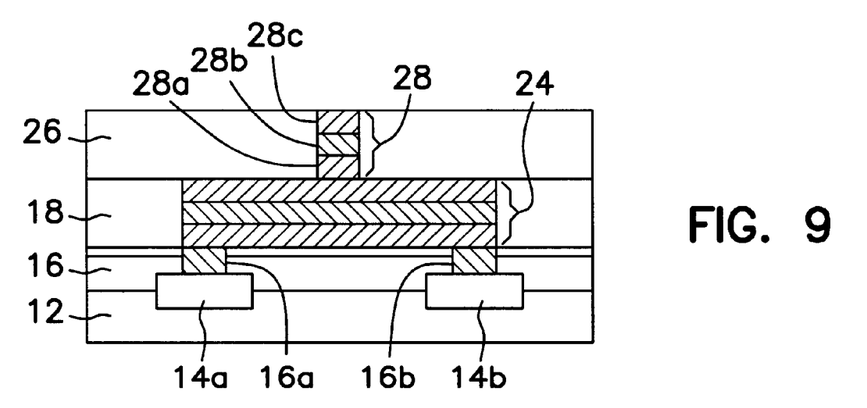
FIG. 9 is a cross-sectional view of the FIG. 8 assembly after formation of a second metallization level including insulative layer 26 and conductor 28.

FIG. 9 shows a completed second-level metallization, specifically a second insulative layer 28 and a second three-layer metal conductor 28. In the exemplary embodiment, conductor 28 is a via, contact, or vertical stud electrically connected to conductor 24 and thus also to transistors 14a and 14b. In other embodiments of the invention, conductor 28 is a conductive line which crosses, or intersects, conductor 24.

Formation of both layer 28 and conductor 28 generally follows the exemplary procedure used for insulative layer 18 and conductor 24. In brief, this entails forming layer 28 of an insulative material similar to layer 18; forming a mask having one or more openings that define, for example, studs, contacts, or vias. Afterward, the method etches a corresponding opening in layer 28, which extends underneath the mask to create overhangs similar to those shown for mask 20 and trench 22 in FIG. 5. With the mask in place, the next steps form a 10-nanometer-thick barrier layer 28a and a 50-nanometer-thick adhesion layer 28b, both on the mask and on insulative layer 26. Then after removing the mask, electroless deposition or chemical vapor deposition is used to form the third layer 28c of conductor 28. Subsequent metallizations would follow similarly.

Although the embodiments described above follow a single damascene process, other embodiments follow a dual-damascene process. The dual-damascene process generally entails separate maskings to form the vias and trenches in an insulative layer. After formation of the via and trenches, the method proceeds with deposition of the barrier and seed materials (using the trench mask as a stencil) into the trenches, liftoff of the trench mask, and selective deposition of a metal onto the seed material.

Exemplary Embodiment of an Integrated Memory Circuit

Figure 10:
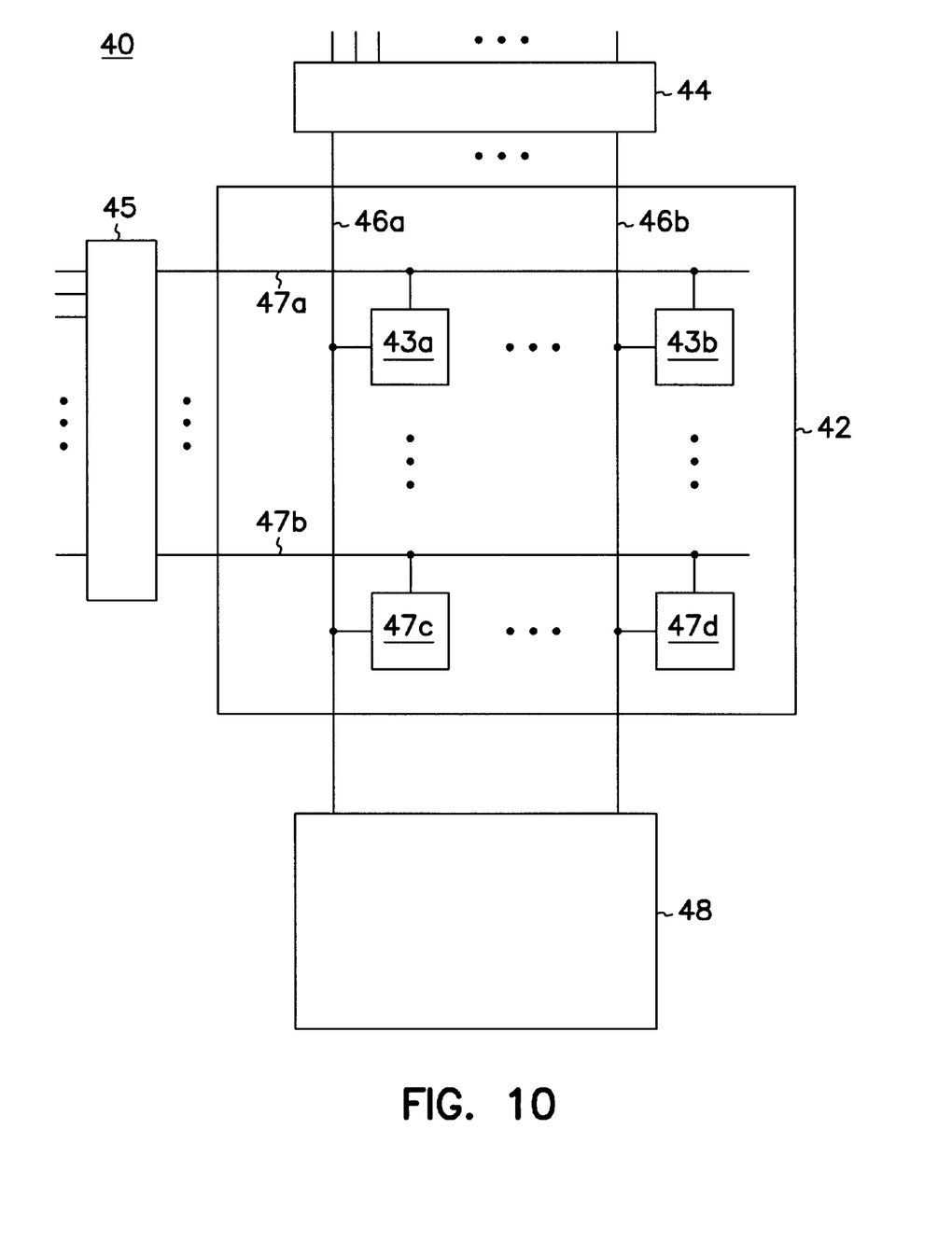
FIG. 10 is a block diagram of a generic integrated memory circuit incorporating one or more interconnect structures of the present invention.

FIG. 10 shows one example of the unlimited number of integrated circuits which would benefit from incorporation of the faster, more-efficient, and more-reliable interconnect structures of the present invention: a generic integrated memory circuit 40. Memory circuit 40, which operates according to well-known and understood principles, is generally coupled to a processor (not shown) to form a computer system. More particularly, circuit 40 includes a memory array 42 which comprises a number of memory cells 43, a column address decoder 44, and a row address decoder 45, bit lines 46, word lines 47, and voltage-sense-amplifier circuit 48 coupled in conventional fashion to bit lines 46.

In the exemplary embodiment, the memory cells, the address decoders, and amplifier circuit are interconnected via at least one gold, silver, or copper conductor formed according to a method embodying the present invention. In other embodiments, only certain components, for example memory array 42 and voltage-sense-amplifier circuit 48, are interconnected via such conductors. Moreover, some embodiments embed these conductors in non-acid-based polymeric insulators, which ultimately reduce capacitance and thus enhance efficiency and speed of the integrated circuit.

Conclusion

In furtherance of the art, the inventor has developed methods of making integrated-circuit wiring systems not only from superior metals such as gold, silver, and copper, but also from superior, capacitance-reducing polymeric insulators. To overcome the inability of conventional etch-based techniques to work with gold, silver and copper, the inventor devised a liftoff procedure, which in one embodiment entails forming a hole or trench through an opening in a mask structure, at least partially filling the hole or trench with gold, silver, or copper, lifting off the mask structure, and then finishing filling the trench with metal using an electroless deposition. And, to overcome problems with polymers reacting with certain metals, such as copper, the inventor devised a unique polymer-formation procedure involving a non-acid-polymeric precursor and non-oxidizing cure technique. In sum, various embodiments of the invention ultimately facilitate fabrication of integrated circuits, such as integrated memory circuits, with superior speed, efficiency, and reliability.

The embodiments described above are intended only to illustrate and teach one or more ways of practicing or implementing the present invention, not to restrict its breadth or scope. The actual scope of the invention, which encompasses all ways of practicing or implementing the concepts of the invention, is defined only by the following claims and their equivalents.

What is claimed is:

1. An integrated-circuit assembly comprising:
   one or more transistors;
   an oxidation-resistant polymeric layer overlying the transistors, wherein the oxidation-resistant polymeric layer comprises a non-acid-based polymeric precursor.

2. The integrated-circuit assembly of claim 1, further comprising:
   one or more conductors overlying the polymeric layer and electrically coupled to the one or more transistors.

3. An integrated-circuit assembly comprising:
   one or more transistor contact regions;
   an oxidation-resistant polymeric layer having one or more openings, with each opening exposing at least a portion of one of the transistor contact regions;
   a diffusion-barrier layer having a diffusion-barrier portion within each opening of the oxidation-resistant polymeric layer, with each diffusion-barrier portion covering at least a portion of one or more of the transistor contact regions; and
   a copper-, silver-, or gold-based conductive structure having a conductive portion within each opening of the oxidation-resistant polymeric layer, with each conductive portion covering at least a portion of the diffusion-barrier portion within the opening.

4. The integrated-circuit assembly of claim 3, wherein the oxidation-resistant polymeric layer comprises a non-acid-based polymeric precursor.

5. An integrated-circuit assembly comprising:
   one or more transistor contact regions;
   an oxidation-resistant polymeric layer having one or more openings, with each opening exposing at least a portion of one of the transistor contact regions;
   a diffusion-barrier layer having a diffusion-barrier portion within each opening of the oxidation-resistant polymeric layer, with each diffusion-barrier portion covering at least a portion of one or more of the transistor contact regions and having one or more diffusion-barrier sidewalls;
   a first copper-, silver-, or gold-based conductive structure having a first conductive portion within each opening of the oxidation-resistant polymeric layer, with each conductive portion covering at least a portion of the diffusion-barrier portion within the opening and having a top surface and one or more conductive sidewalls; and
   a second copper-, silver-, or gold-based conductive structure having a second conductive portion within each opening of the oxidation-resistant polymeric layer, with the second conductive portion contacting the top surface and at least one of the conductive sidewalls of the first conductive structure and at least one of the diffusion-barrier sidewalls.

6. The integrated-circuit assembly of claim 5, wherein the oxidation-resistant polymeric layer comprises a non-acid-based polymeric precursor.

7. An integrated-circuit assembly comprising:
   one or more transistor contact regions;
   an oxidation-resistant polymeric layer having one or more openings, with each opening exposing at least a portion of one of the transistor contact regions;
   a diffusion-barrier layer having a diffusion-barrier portion within each opening of the oxidation-resistant polymeric layer, with each diffusion-barrier portion covering at least a portion of one or more of the transistor contact regions; and
   a copper-based conductive structure having a conductive portion within each opening of the oxidation-resistant polymeric layer, with each conductive portion covering at least a portion of the diffusion-barrier portion within the opening.

8. The integrated-circuit assembly of claim 7, wherein the oxidation-resistant polymeric layer comprises a non-acid-based polymeric precursor.

9. An integrated-circuit assembly comprising:

one or more transistor contact regions;

an oxidation-resistant polymeric layer having one or more openings, with each opening exposing at least a portion of one of the transistor contact regions;

a diffusion-barrier layer having a diffusion-barrier portion within each opening of the oxidation-resistant polymeric layer, with each diffusion-barrier portion covering at least a portion of one or more of the transistor contact regions; and a silver- or gold-based conductive structure having a conductive portion within each opening of the oxidation-resistant polymeric layer, with each conductive portion covering at least a portion of the diffusion-barrier portion within the opening.

10. The integrated-circuit assembly of claim 9, wherein the oxidation-resistant polymeric layer comprises a non-acid-based polymeric precursor.

11. An integrated-circuit assembly comprising:

one or more transistor contact regions;

an oxidation-resistant polymeric layer having one or more openings, with each opening exposing at least a portion of one of the t or contact regions;

a diffusion-barrier layer having a diffusion-barrier portion within each opening of the oxidation-resistant polymeric layer, with each diffusion-barrier portion covering at least a portion of one or more of the transistor contact regions and having one or more diffusion-barrier sidewalls;

a first copper-based conductive stricture having a first conductive portion within each opening of the oxidation-resistant polymeric layer, with each conductive portion covering at least a portion of the diffusion-barrier portion within the opening and having a top surface and one or more conductive sidewalls; and a second copper-based conductive having a second conductive portion within each opening of the oxidation-resistant polymeric layer, with the second conductive portion contacting the top surface and at least one of the conductive sidewalls of the first conductive structure and at least one of the diffusion-barrier sidewalls.

12. The integrated-circuit assembly of claim 11, wherein the oxidation-resistant polymeric layer comprises a non-acid-based polymeric precursor.

13. An integrated-circuit assembly comprising:

one or more transistor contact regions;

an oxidation-resistant polymeric layer having one or more openings, with each opening exposing at least a portion of one of the transistor contact regions;

a diffusion-barrier layer having a diffusion-barrier portion within each opening of the oxidation-resistant polymeric layer, with each diffusion-barrier portion covering at least a portion of one or more of the transistor contact regions and having one or more diffusion-barrier sidewalls;

a first silver- or gold-based conductive structure having a first conductive portion within each opening of the oxidation-resistant polymeric layer, with each conductive portion covering at least a portion of the diffusion-barrier portion within the opening and having a top surface and one or more conductive sidewalls; and a second silver- or gold-based conductive structure having a second conductive portion within each opening of the oxidation-resistant polymeric layer, with the second conductive portion contacting the top surface and at least one of the conductive sidewalls of the first conductive structure and at least one of the diffusion-barrier sidewalls.

14. The integrated-circuit assembly of claim 13, wherein the oxidation-resistant polymeric layer comprises a non-acid-based polymeric precursor.

\* \* \* \* \*

UNITED STATES PATENT AND TRADEMARK OFFICE
CERTIFICATE OF CORRECTION

PATENT NO.    : 6,288,442 B1  
DATED         : September 11, 2001  
INVENTOR(S)   : Paul A. Farrar It is certified that error appears in the above-identified patent and that said Letters Patent is hereby corrected as shown below:

Title page,  
Item [22], Filed, delete "Sep. 10, 1998" and insert Sep. 1, 1998 --, therefor.

Column 9, claim 11,  
Line 25, "t or" and insert -- transistor --, therefor.  
Line 31, delete "stricture" and insert -- structure --, therefor.  
Line 38, insert -- structure -- between "conductive" and "having".

Signed and Sealed this

Sixteenth Day of April, 2002

Attest:

Attesting Officer

JAMES E. ROGAN  
*Director of the United States Patent and Trademark Office*